United States Patent [19]

Yevak, Jr. et al.

[11] Patent Number: 4,645,278
[45] Date of Patent: Feb. 24, 1987

[54] CIRCUIT PANEL CONNECTOR, PANEL SYSTEM USING THE CONNECTOR, AND METHOD FOR MAKING THE PANEL SYSTEM

[75] Inventors: Harold M. Yevak, Jr., Westboro; Larry K. Johnson, North Attleboro; Austin S. O'Malley, Rehoboth, all of Mass.

[73] Assignee: Texas Instruments Incorporated, Dallas, Tex.

[21] Appl. No.: 773,904

[22] Filed: Sep. 9, 1985

[51] Int. Cl.$^4$ ...................... H01R 9/09; H01R 13/447
[52] U.S. Cl. ................................... 339/17 T; 29/837; 29/841; 228/212; 339/36
[58] Field of Search .............. 339/17 R, 17 C, 17 CF, 339/17 D, 17 T, 36, 38, 44 R, 210 R, 210 M, 275 B; 29/837, 838, 839, 840, 843, 841; 228/212

[56] References Cited

U.S. PATENT DOCUMENTS

| 4,010,992 | 3/1977 | Crimmins et al. | 339/275 B |
| 4,217,024 | 8/1980 | Aldridge et al. | 339/17 CF |
| 4,396,245 | 8/1983 | Lane | 339/38 |

FOREIGN PATENT DOCUMENTS

| 2129918 | 12/1972 | Fed. Rep. of Germany | 339/17 C |
| 935829 | 9/1963 | United Kingdom | 339/38 |

*Primary Examiner*—Neil Abrams
*Attorney, Agent, or Firm*—James P. McAndrews; John A. Haug; Melvin Sharp

[57] ABSTRACT

An improved circuit panel connector comprises an electrically insulating body having a plurality of openings extending through the body and has electrical contacts such as screw machine contact assemblies movably mounted in the respective body openings so that posts extend from the openings at one side of the body and terminal entry portions of the contacts are accessible at an opposite side of the body. A plate having a plurality of protuberances formed therein is disposed over the opposite connector body side with the protuberances fitted into the terminal entry portions of the contacts for spacing the movably mounted contacts relative to each other in the connector body openings. A polyimide tape is adhesively and detachably secured to the body over the plate for holding the plate on the body and for sealing the body openings. The contact posts are inserted into corresponding openings in a circuit panel and soldered to circuit paths on the panel. If desired, conformal coating materials are applied to the circuit panel over the connector, the tape serving to exclude such coating materials from the contact members in the connector body openings. The tape is then detached for permitting insertion of component terminals into the terminal entry portions of the connector contacts for mounting the component on the connector.

13 Claims, 2 Drawing Figures

CIRCUIT PANEL CONNECTOR, PANEL SYSTEM USING THE CONNECTOR, AND METHOD FOR MAKING THE PANEL SYSTEM

BACKGROUND OF THE INVENTION

The field of this invention is that of circuit panel systems and the inventions relates more particularly to improved connectors for use in such systems and to methods for making such systems.

Typically screw machine contact assemblies used in high reliability military printed circuit panel connectors and the like are mounted in openings in insulating connector bodies and are retained in those openings by individual metal C-clips. The connectors are mounted on a circuit panel with contact member posts extending from the connector body and fitted into corresponding openings in the circuit panel and soldered to circuit paths on the circuit panel. The cost of fabricating and assembling these numerous tiny clips adds significantly to the total connector manufacturing cost and the clips tend to be difficult to remove when replacement of a contact member soldered in a circuit panel system is required.

SUMMARY OF THE INVENTION

It is an object of this invention to provide a novel and improved circuit panel connector; to provide a novel and improved circuit panel system using such a connector; and to provide a novel and improved method for making such a circuit panel system.

Briefly described, the novel and improved connector of this invention comprises an electrically insulating body having a plurality of openings extending through the body. Preferably the openings have a relatively small first portion at the bottom side of the connector body and have a relatively larger second portion adjacent the opposite top side of the body so that a shoulder is formed in each opening between the noted portions of the opening to face generally toward the top side of the connector. A plurality of electrical contact members, preferably comprising conventional screw machine contact assemblies or the like, are movably mounted in the respective connector body openings so that post portions of the contact members extend from openings at the bottom side of the connector bodies and so that terminal entry portions of the contact members are disposed within the relatively larger portions of the body openings to be accessible at the top side of the connector body for receiving and resiliently, electrically engaging terminals of an electrical component inserted therein. The contact members are movably mounted in the body openings to rest against the noted shoulders within the openings. Preferably the terminal entry portions of the contact members comprise generally cylindrical sleeves which extend around the outer periphery of the terminal entry portions of the contact members and which are open at one sleeve end for receiving the component terminals therein.

In accordance with this invention, a plate having a plurality of protuberances formed thereon is removably disposed over the top side of the connector body with the protuberances fitted into the terminal entry portions of the contact members for spacing the movably mounted contact members relative to each other within the respective connector body openings and for retaining the contact members in the body openings. Preferably for example, the plate comprises a thin metal sheet of stainless steel or the like having a plurality of dimples therein forming the desired protuberances in a semispherical form and the protuberances are fitted into the open sleeve ends on the terminal entry portions of the contact members for centering the contact members on the protuberances to facilitate relative spacing of the contact members. Preferably also, an adhesive means such as a tape of a high-temperature-resistant polyimide material or the like having a layer of a high-temperature adhesive thereon is adhesively and detachably secured to the connector body over the plate for retaining the plate on the body bearing against the contact members to hold the terminal entry portions of the contact members against the shoulders in the openings and for sealing the body openings at the top of the connector. Preferably an additional, flexible, heat-curable adhesive sealing means such as a conventional epoxy or a silicone sealing means or the like is secured to the bottom of the connector body around the connector body openings.

In the method of this invention, the improved connector as above described is mounted on a circuit panel of generally conventional type having circuit paths defined on the panel by having post portions of the contact members inserted into corresponding openings in the circuit panel at selected locations relative to the circuit paths. The contact members are then soldered to the circuit paths in conventional manner for securing the movable contact members in secure electrical engagement with the circuit paths and for holding the connector body in a fixed position on the circuit panel. If desired, a conformal coating of an acrylic material or the like is applied over the circuit panel and connector by dipping or spraying or the like in any conventional manner for providing a moisture seal over the circuit paths and the connector as will be understood. In that procedure, the tape on the connector body excludes the conformal coating materials from the connector body openings and from the terminal entry portions of the contact members in the body openings. The tape is then peeled off and removed from the connector body with the plate for permitting the insertion of terminals from an integrated circuit component or the like into the terminal entry portions of the contact members for mounting the component on the connector and electrically connecting the component terminals to selected circuit paths on the a circuit panel as will be understood. Where the connector has an additional flexible heat-curable sealing means secured to the bottom of the connector body as above described, the sealing means is engaged in sealing relation with the circuit panel around the body openings at the bottom of the connector and is preferably subjected to heat-treatment for curing the sealing means, preferably during soldering of the contact members to the circuit panel. In this way, a novel and improved circuit panel connector and system are provided which have improved low cost constructions while also being adapted to provide improved, more reliable service. The noted arrangement also permits easier replacement of a soldered connector contact, the contact being easily separated from its soldered connection by applying heat to the contact post and then being easily withdrawn from the top of the connector body.

DESCRIPTION OF THE DRAWINGS

Other objects, advantages and details of the improved circuit panel connector, system and method of this invention appear in the following detailed description of preferred embodiments of the invention, the detailed description referring to the drawings in which.

DESCRIPTION OF THE PREFERRED EMBODIMENT

Figure 1:
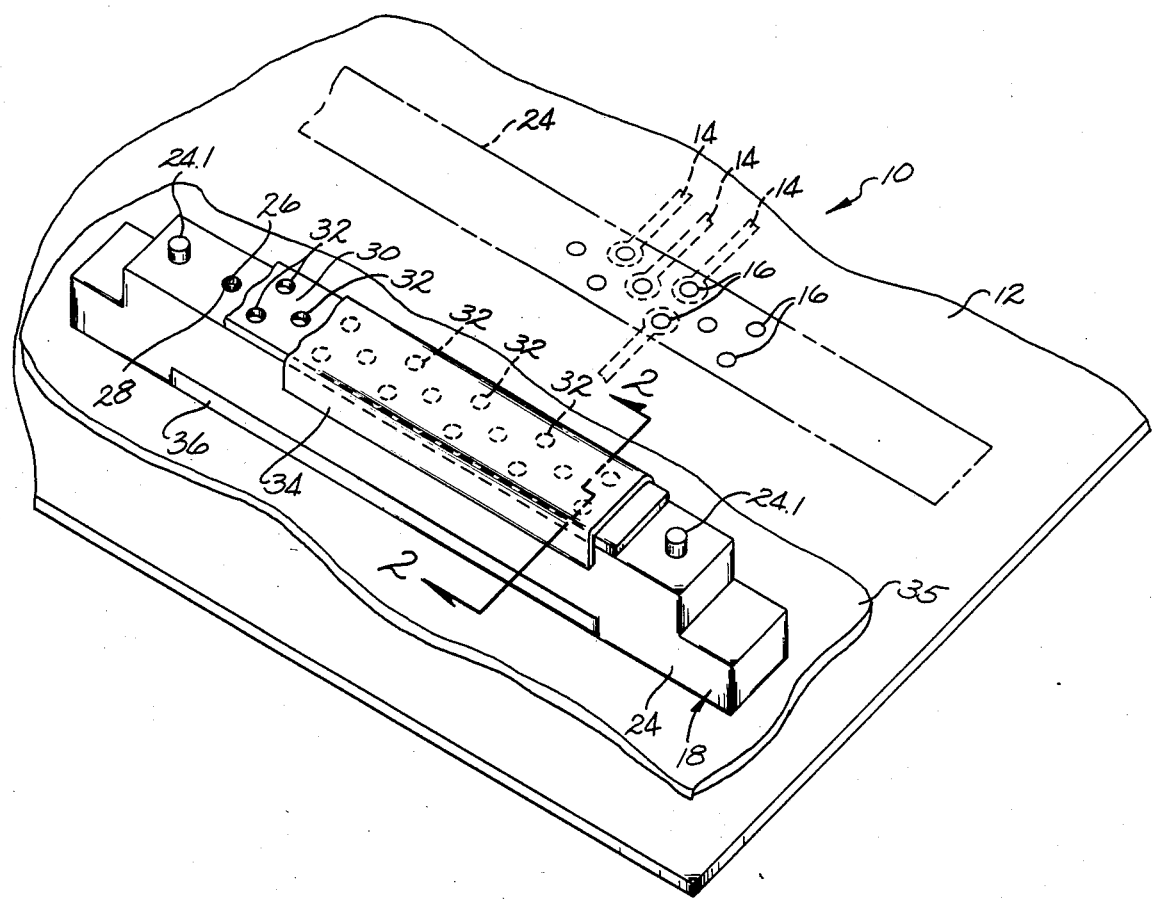
FIG. 1 is a perspective view of a circuit panel system provided by this invention.

Referring to the drawings, 10 in FIG. 1 indicates a novel and improved circuit panel system of this invention which is shown to include a generally conventional circuit panel 12 of an organic or ceramic electrical insulating material or the like having electrically conductive metal foil circuit paths 14 or the like defined thereon in a selected circuit pattern. Preferably a plurality of openings 16 are formed in the circuit panel in selected locations relative to the circuit paths in conventional manner.

Figure 2:
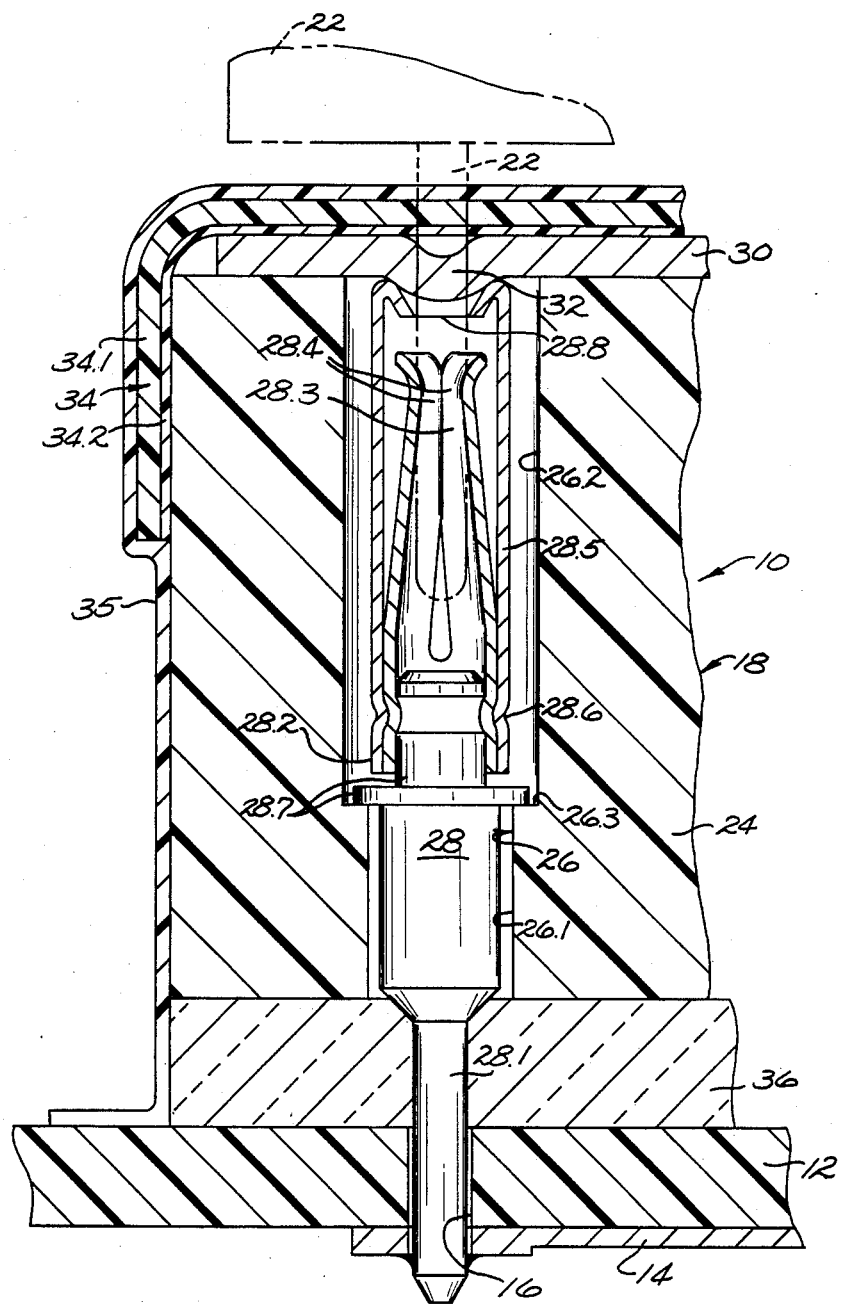
FIG. 2 is a section to enlarged scale along line 2—2 of FIG. 1.

At least one novel and improved circuit panel connector 18 as provided by this invention is mounted on the circuit panel 12 and at least one electrical component such as a conventional integrated circuit component 20 having a plurality of component terminals 22 thereon is adapted to be mounted on the connector as is diagrammatically indicated in broken lines in FIG. 2.

In accordance with this invention the improved circuit panel connector 18 comprises a body 24 of an electrically insulating material such as polyphenylenesulfide or diallylphthalate or the like and is provided with a plurality of openings 26 therein extending through the body. A plurality of generally conventional electrical contact members 28 are movably mounted in the respective connector body openings, each contact member having a post portion 28.1 extending from the body opening at one, bottom side of the connector body and having a terminal entry portion 28.2 accessible in the body opening at an opposite, top side of the connector body. Preferably the connector body openings have a first portion 26.1 of relatively small diameter receiving the post portion of the contact member and a relatively larger portion 26.2 adjacent the top of the connector body accommodating the terminal entry portion of the contact member therein. In that arrangement, a shoulder 26.3 is formed in each connector body opening between the noted portions of the body opening with the shoulder facing generally toward the top of the connector body and the contact member is disposed in the body opening with the terminal entry portion of the contact member resting against the shoulder 26.3. Preferably for example, the contact members 28 comprise generally conventional high-reliability, military, screw machine contact members incorporating a post portion 28.1 in the form of a rod of brass or the like. Preferably the terminal entry portion 28.2 of the contact member comprises a spring cylinder or clip 28.3 of beryllium copper or the like having spring leaves 28.4 formed therein and a sleeve or shroud 28.5 fitted around the outer perimeter of the terminal entry portion of the member and swaged as at 28.6 to a flanged stud part 28.7 of the brass rod, the sleeve having an opening 28.8 at one end for receiving a component terminal 22 therein to be resiliently electrically engaged in the clip 28.3 as shown particularly in FIG. 2. Preferably the contact member 28 is more or less symmetrical around a longitudinal axis extending through the terminal entry and post portions of the member as illustrated in FIG. 2 and the contact member is disposed in a connector body opening to be freely rotatable and axially slidable against shoulder 26.3 in the opening as shown. However, other contact member configurations including contact assemblies having flat posts and spring leaf portions blanked from a sheet material or the like and enclosed in a steel shroud are also adapted to be used in the connector of this invention.

In accordance with this invention, the connector 18 further includes a plate 30 having a plurality of protuberances 32 formed therein, the plate being removably disposed on the top side of the connector body so the protuberances are fitted into the terminal entry portion of the contact member 28 for spacing the contact members relative to each other within the openings in the connector body. Preferably for example, the plate comprises a thin metal sheet of stainless steel or the like having a plurality of semispherical dimples formed therein for providing the desired protuberances. The protuberances are then received in the sleeve openings 28.8 on the terminal entry portions of the contact members so that the contact members tend to be centered on the protuberances, thereby to be precisely spaced relative to each other in the body openings, the plate bearing against the contact members to hold the contact members in that precisely spaced location bearing against the shoulders 26.3 in the connector body openings.

In a preferred embodiment of the invention, the plate member 30 is secured in the described position on the connector body 24 by adhesive means such as a tape 34 which is adhesively and detachably secured to the connector body over the plate and preferably over the openings 26 formed in the top of the connector body. That is, the tape 34 is preferably formed of a material sold under the designation Kapton having layer 34.1 of a high-temperature-resistant polyimide material or the like and having an additional layer 34.2 of a conventional high temperature adhesive material. The plate 30 is preferably proportioned to substantially cover the top of the connector body and to extend over all of the connector body openings on the top side of the body and the tape is preferably folded over the top of the body and extended down along lateral sides of the body to adhere to the lateral body sides. Where the connector body has locating holes or pins or the like 24.1 therein, the tape 34 may cover such locating means as well if desired.

In accordance with the invention, the connector 18 as above described is mounted on a circuit panel 12 by inserting the contact member posts in corresponding openings in the circuit panel and the posts are soldered to selected circuit paths on the pins in conventional manner. The engagement of the soldered contact members with the shoulders 28.3 in the openings secures the connector body in a fixed location on the circuit panel.

Preferably a conformal coating 35 of an acrylic material or the like is applied over the circuit panel and connector by dipping or spraying or the like in conventional manner for providing a moisture seal. In that procedure, the tape 34 serves to exclude the conformal coating material from the connector body openings and from the terminal entry portions of the connector contacts in the openings. The tape 34 is then peeled from the connector body and the plate member is removed for permitting insertion of the component terminals 22 into the terminal entry portions of the contact members for mounting the component 20 on the connector and for electrically connecting the component terminals 22 to the selected circuit paths on the circuit panel.

Where desired, an additional, either rigid or flexible, heat-curable otherwise adherent adhesive sealing means 36 of an epoxy material or a silicone material or the like is secured by adhesion of the like to the bottom side of the connector body so that when the connector is mounted on the circuit panel the additional adhesive layer engages the circuit panel. The panel system is then subjected to heat-treatment (as during the soldering of the contact members to the circuit paths or the like) for curing the additional adhesive layer to seal the bottom side of the connector body to the circuit panel, thereby to further assure exclusion of subsequently applied conformal coating materials and other extraneous materials from entry into the connector body openings from the bottom side of the connector.

In that arrangement, the connector 18 is easily and economically manufactured and assembled. The plate and tape elements are adapted to be fed from reels and cut off at appropriate lengths either as they are disposed on the connector body or immediately prior to being attached to the connector body. Connector contacts are movably mounted in the connector body openings with ease and convenience to facilitate precise mounting and spacing of the contact members in circuit panel openings substantially free of stresses thereon and are provided with improved, more uniform spacing relative to each other in the connector body openings by the plate element. The tape 34 excludes conformal coating materials from the connector 18 and is then easily and conveniently removed for permitting insertion of electrical component terminals into the connector contact members.

It should be understood that although particular embodiments of this invention have been described by way of illustrating the invention, this invention includes all modifications and equivalence of the disclosed embodiments falling within the scope of the appended claims.

We claim:

1. A connector for mounting a component and for electrically connecting component terminals to circuit paths on a circuit panel comprising an electrically insulating body having a plurality of through openings, and electrical contact members mounted in the respective openings having respective post portions at one end extending from the openings at one side of the body to be soldered to selected circuit paths on the circuit panel and having respective terminal entry portions at an opposite end accessible from an opposite side of the body for receiving and resiliently, electrically engaging respective components terminals, characterized in that the contact members are movably disposed in the respective openings, a plate is disposed over the opposite body side and has a plurality of portions disposed in selected spaced relation to each other engaging the respective contact members for positioning the movable contact members relative to each other at said selected spacing in the body openings and retaining the contact members in the openings with said spacing, and means detachably securing the plate to the body for positioning the contact members relative to each other in the body openings until the contact members are soldered to circuit paths on the circuit panel in said selected spaced relation and for permitting removal of the plate after such soldering to permit insertion of component terminals into terminal entry portions of the respective contact members.

2. A connector for mounting a component and for electrically connecting component terminals to circuit paths on a circuit panel comprising an electrically insulating body having a plurality of openings extending through the body, and electrical contact members mounted in the respective openings having respective post portions at one end extending from the openings at one side of the body to be soldered to selected circuit paths on the circuit panel and having respective terminal entry portions at an opposite end to be accessible from an opposite side of the body for receiving and resiliently, electrically engaging respective components terminals, characterized in that the contact members are movably disposed in the respective openings, a plate having a plurality of protuberances formed in selected spaced relation to each other thereon is disposed in a selected disposition over the opposite body side with the protuberances fitted into respective terminal entry portions of the contact members for positioning and spacing the movably mounted contact members at said selected spacing relative to each other in the body openings, and adhesive means detachably securing the plate to the body in said selected disposition for retaining the contact members with said selected spacing in the body openings until the contact members are soldered to circuit paths on the circuit panel and for permitting subsequent removal of the plate to allow insertion of the component terminals into the terminal entry portions of the respective contact members.

3. A connector according to claim 2 further characterized in that the plate comprises a flat sheet having dimples formed therein to provide said protuberances and the contact members comprise generally cylindrical sleeves disposed around outer perimeters of the terminal entry portions of the contact members, the sleeves being open at one end for receiving component terminals therein, and the protuberances are received in said open sleeve ends to center the movably mounted contact members thereon for facilitating positioning and spacing of the contact members relative to each other in the connector body openings.

4. A connector according to claim 3 further characterized in that the adhesive means comprises a tape adhesively and detachably secured to the body over the plate and over the body openings for sealing the openings at the opposite body side, whereby, when conformal coating materials are applied to a circuit panel over the connector after soldering of the contact members to circuit paths on the circuit panel, the tape excludes the conformal coating materials from the body openings and is adapted to be subsequently removed to permit component terminals to be inserted into the terminal entry portions of the contact members.

5. A connector for mounting an electrical component on a circuit panel and electrically connecting component terminals to circuit paths on the circuit panel comprising an electrically insulating body having a plurality of openings extending through the body, and a plurality of electrical contact members mounted in the respective body openings, the contact members having respective post portions at one end extending from the body openings at one side of the body to be the circuit panel, characterized in that each body opening has a first portion of selected size and has a relatively larger portion adjacent the opposite body side forming a shoulder between said portions of the opening within the opening, the contact members are movably mounted in the openings and have the terminal entry portions thereof disposed in the relatively larger portions of the body openings to engage said shoulders within the openings and each comprise a generally cylindrical sleeve fitted around the outer perimeter of the terminal entry portion of the contact member, the sleeve being open at one end for receiving a component terminal therein, a flat metal plate has a plurality of dimples forming protuberances in selected spaced relation to each other thereon and is disposed over the opposite body side with the protuberances fitted into the open sleeve ends for centering the contact members thereon to space the contact members at said selected spacing relative to each other within the body openings, the plate bearing against the contact members for normally holding the contact members against said shoulders, and a polyimide tape is adhesively and detachably secured to the body over the plate for removably holding the plate in said assembled relation so that the plate member holds the contact members in said selected spacing relative to each other against said shoulders during soldering of the contact members to circuit paths on a circuit panel for precisely locating the contact members on the circuit panel with said selected spacing and securing the connector body in a fixed location on the circuit panel, for sealing the body openings at the opposite connector body side and excluding conformal coating materials from the body openings when such coatings are applied to the circuit panel and connector after soldering the contact members to circuit paths on the circuit panel, and for permitting the tape and plate to be thereafter removed for permitting insertion of components terminals into the terminal entry portions of the contact members for mounting the component on the connector.

6. A connector according to claim 5 further characterized in that an additional, flexible, heat-curable adhesive sealing means is provided on said one body side to be sealingly engaged with a circuit panel during soldering of the contact members to circuit paths on the circuit panel and the sealing means is adapted to be cured during soldering of the contact members to circuit paths on the circuit panel for excluding entry of conformal coating materials from the body openings at said one body side.

7. A circuit panel system for mounting a component and for electrically connecting component terminals in an electrical circuit comprising a circuit panel having circuit paths defined thereon and have a plurality of openings disposed in selected locations relative to the circuit paths, an electrically insulating connector body having a plurality of openings extending through the body aligned with respective openings in the circuit panel, a plurality of electrical contact members movably disposed in the connector body openings in selected spaced relation to each other each having a post portion extending from a connector body opening at one side of the body into a corresponding circuit panel opening and soldered to a selected circuit path on the circuit panel and each having a terminal entry portion to be accessible in the body opening from an opposite side of the body for receiving and resiliently, electrically engaging a component terminal therein for mounting the component on the circuit panel, characterized in that a plate which has a plurality of protuberances formed in selected spaced relation to each other thereon is disposed over the opposite body side with the protuberances fitted into respective terminal entry portions of the contact members for spacing the contacts with said selected spacing relative to each other in the body openings, and tape means are adhesively and detachably secured to the connector body over the plate and over the body openings for sealing the connector body openings at the opposite body side, so that when conformal coating materials are applied to the circuit panel system, the tape excludes the conformal coating materials from the connector body openings and the tape and plate are adapted to be subsequently removed to permit component terminals to be inserted into the terminal entry portions of the contact members.

8. A circuit panel system for mounting a component and for electrically connecting component terminals in an electrical circuit comprising a circuit panel having circuit paths defined thereon and have a plurality of openings disposed in selected locations relative to the circuit paths, an electrically insulating connector body having a plurality of openings extending through the body aligned with respective openings in the circuit panel, a plurality of electrical contact members movably disposed in the connector body openings each having a post portion extending from a connector body opening at one side of the body into a corresponding circuit panel opening and soldered to a selected circuit path on the circuit panel and each having a terminal entry portion to be accessible in the body opening from an opposite side of the body for receiving and resiliently, electrically engaging a component terminal therein for mounting the component on the circuit panel, characterized in that a plate having a plurality of protuberances formed thereon is disposed over the opposite body side with the protuberances fitted into respective terminal entry portions of the contact members spacing the contacts relative to each other in the body openings, and tape means are adhesively and detachably secured to the connector body over the plate and over the body openings for sealing the connector body openings at the opposite body side, a conformal coating covers the circuit panel system, and the tape and plate are adapted to be removed to permit the component terminals to be inserted into the terminal entry portions of the contact members, whereby, when the conformal coating materials are applied to the circuit panel system, the tape excludes the conformal coating materials from the connector body openings.

9. A circuit panel system as set forth in claim 8 further characterized in that the connector body carries a sealing means on said one connector side sealingly engaging the circuit panel beneath said conformal coating.

10. A method for making a circuit panel system comprising the steps of providing a circuit panel having circuit paths defined thereon and having a plurality of openings disposed in selected locations relative to the circuit paths; providing a connector comprising an electrically insulating body having a plurality of openings extending through the body, a plurality of contact members movably disposed in the respective body openings, the contact members having respective post portions at one end extending from the body openings at one side of the body and having respective terminal entry portions to be accessible from an opposite side of the body, a plate having a plurality of protuberances formed in selected spaced relation to each other therein disposed over the opposite connector body side with the protuberances fitted into respective terminal entry portions of the contact members spacing the contact members at said selected spacing relative to each other in the body openings, and a tape adhesively and detachably secured to the body over the plate and over the connector body openings at the opposite connector body side for sealing the openings; inserting the post portions of the contact members of the connector in corresponding openings in the circuit panel; soldering the post portions of the contact members in the circuit panel openings at said selected spacing to selected circuit paths on the circuit panel; removing the tape and plate members from the connector; inserting terminals of an electrical component into the terminal entry portions of the contact member to be received and resiliently and electrically engaged by the contact members for mounting the component on the connector and electrically connecting the component terminals to said selected circuit paths on the circuit panel.

11. A method for making a circuit panel system comprising the steps of providing a circuit panel having circuit paths defined thereon and having a plurality of openings disposed in selected locations relative to the circuit paths; providing a connector comprising an electrically insulating body having a plurality of openings extending through the body, a plurality of contact members disposed in the respective body openings, the contact members having respective post portions at one end extending from the body openings at one side of the body and having respective terminal entry portions to be accessible from an opposite side of the body, a plate having a plurality of protuberances formed therein disposed over the opposite connector body side with the protuberances fitted into respective terminal entry portions of the contact members spacing the contact members relative to each other in the body openings, and a tape adhesively and detachably secured to the body over the plate and over the connector body openings at the opposite connector body side for sealing the openings; inserting the post portions of the contact members of the connector in corresponding openings in the circuit panel; soldering the post portions of the contact members in the circuit panel openings to selected circuit paths on the circuit panel; applying a conformal coating material is applied to the circuit panel and connector for moisture sealing the circuit paths and connector on the circuit panel prior to removing the tape and plate from the connector to receive insertion of component terminals so that the tape excludes such conformal coating materials from the connector body openings removing the tape and plate members from the connector; inserting terminals of an electrical component into the terminal entry portions of the contact member to be received and resiliently and electrically engaged by the contact members for mounting the component on the connector and electrically connecting the component terminals to said selected circuit paths on the circuit panel.

12. A method according to claim 11 further characterized in that the connector has a flexible, heat-curable adhesive sealing means secured to said one side of the connector body and the flexible heat sealing means is heat-treated for sealingly securing the flexible sealing means to the circuit panel.

13. A method as set forth in claim 12 wherein said heat-treating of the flexible sealing means is performed during said soldering.

* * * * *